United States Patent
Zhu et al.

(10) Patent No.: US 9,395,745 B2
(45) Date of Patent: Jul. 19, 2016

(54) REDUNDANT CLOCK SWITCHOVER

(71) Applicant: ANALOG DEVICES, INC., Norwood, MA (US)

(72) Inventors: Dan Zhu, Oak Ridge, NC (US); Reuben Pascal Nelson, Colfax, NC (US); Yi Wang, Reidsville, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/271,790

(22) Filed: May 7, 2014

(65) Prior Publication Data

US 2015/0227162 A1 Aug. 13, 2015

Related U.S. Application Data

(60) Provisional application No. 61/938,013, filed on Feb. 10, 2014.

(51) Int. Cl.
*G06F 1/06* (2006.01)
*H03K 5/14* (2014.01)

(52) U.S. Cl.
CPC ... *G06F 1/06* (2013.01); *H03K 5/14* (2013.01)

(58) Field of Classification Search
CPC ............... H03L 7/06; H03L 7/07; G06F 1/06
USPC .................. 331/2, 46, 49, 50, 55, 56
See application file for complete search history.

(56) References Cited

U.S. PATENT DOCUMENTS

| 4,254,492 | A | | 3/1981 | McDermott, III |
| 5,260,979 | A | * | 11/1993 | Parker ...................... H03L 7/07 331/17 |

(Continued)

FOREIGN PATENT DOCUMENTS

| JP | 03-027620 | 2/1991 |
| JP | 04-158420 | 6/1992 |

(Continued)

OTHER PUBLICATIONS

Analog Devices, AD9558 Data Sheet: Quad Input Multiservice Line Card Adaptive Clock Translator with Frame Sync., Rev. B, Jun. 2013, 104 pages. Available at: http://www.analog.com/static/imported-files/data_sheets/AD9558.pdf (accessed on Oct. 8, 2014).

(Continued)

*Primary Examiner* — Jeffrey Shin
(74) *Attorney, Agent, or Firm* — Knobbe, Martens, Olson & Bear, LLP

(57) ABSTRACT

Aspects of this disclosure relate to reference switchover. In one embodiment, an apparatus includes a phase error detector, a phase alignment detector, and a selection circuit. The phase error detector is configured to generate an indication of a relative phase difference between a first reference clock signal and a second reference clock signal. The phase alignment detector is configured to receive the indication of the relative phase difference and determine when the relative phase difference satisfies a preset threshold. The selection circuit is configured to transition from providing the first reference clock signal as a clock system reference signal to providing the second reference clock signal as the clock system reference signal responsive to the phase alignment detector detecting that the relative phase difference satisfies the preset threshold.

21 Claims, 8 Drawing Sheets

(56) References Cited

U.S. PATENT DOCUMENTS

| | | | |
|---|---|---|---|
| 5,416,443 A | | 5/1995 | Cranford, Jr. et al. |
| 5,550,514 A | * | 8/1996 | Liedberg .............. H03L 7/081 327/141 |
| 7,046,048 B2 | | 5/2006 | Starr et al. |
| 7,126,429 B2 | * | 10/2006 | Mitric .................. H03L 7/093 331/16 |
| 7,893,736 B2 | | 2/2011 | Palmer et al. |
| 7,911,240 B1 | | 3/2011 | Lai et al. |
| 2001/0015678 A1 | * | 8/2001 | Wesolowski .......... H03L 7/143 331/14 |
| 2006/0193417 A1 | * | 8/2006 | Jamison ................ G06F 1/12 375/376 |

FOREIGN PATENT DOCUMENTS

| | | |
|---|---|---|
| JP | 04-346518 | 12/1992 |
| JP | 05-300008 | 11/1993 |
| JP | 06-006211 | 1/1994 |
| JP | 09-284182 | 10/1997 |

OTHER PUBLICATIONS

Analog Devices, AD9548 Data Sheet: Quad/Octal Input Network Clock Generator/Synchronizer, Rev. E, Dec. 2013, 112 pages. Available at: http://www.analog.com/static/imported-files/data_sheets/AD9548.pdf (accessed on Feb. 4, 2014).

Analog Devices, AD9551 Data Sheet: Multiservice Clock Generator, Rev. B, Sep. 2009, 40 pages. Available at: http://www.analog.com/static/imported-files/data_sheets/AD9551.pdf (accessed on Oct. 8, 2014).

Analog Devices, AD9549 Data Sheet: Dual Input Network Clock Generator/Synchronizer, Rev. D. Dec. 2010, 76 pages. Available at: http://www.analog.com/static/imported-files/data_sheets/AD9549.pdf (accessed on Oct. 8, 2014).

Korean Office Action of Dec. 15, 2015 for Korean Patent Application No. 10-2015-0016196, filed Feb. 2, 2015, 7 pages, 6 page translation.

Japanese Office Action of Feb. 12, 2016 for Japanese Patent Application No. 2015-023019. 4 pages, 5 page translation.

German Office Action of May 6, 2016 for German Patent Application No. 102015101745.8, 5 pages.

* cited by examiner

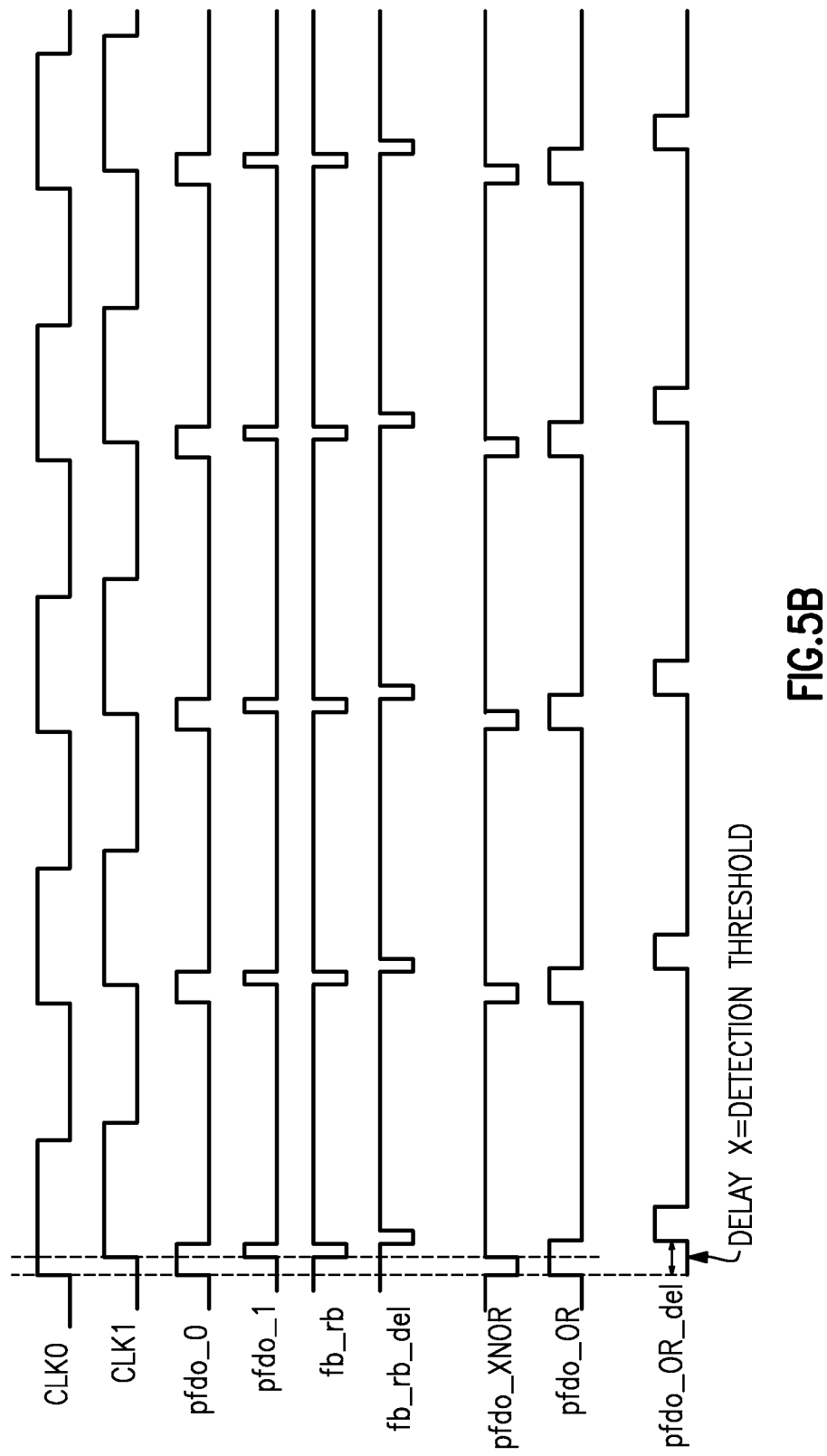

REDUNDANT CLOCK SWITCHOVER

CROSS REFERENCE TO RELATED APPLICATION

This application is a non-provisional of and claims the benefit under 35 U.S.C. §119(e) of U.S. Provisional App. No. 61/938,013, filed Feb. 10, 2014, titled "REDUNDANT CLOCK SWITCHOVER," the entire disclosure of which is hereby incorporated by reference herein.

TECHNICAL FIELD

The disclosed technology relates to electronics, and, more particularly, to switching between different clocks.

DESCRIPTION OF RELATED TECHNOLOGY

Electronic systems can include timing circuits configured to generate clock signals. Such timing circuits can include a phase-locked loop that locks a phase of an output signal with a phase of a reference signal. The reference signal can be generated using a crystal, such as a quartz crystal or a polycrystalline ceramic crystal. A crystal oscillator can generate an electrical signal having a very precise frequency.

Many network applications use a local crystal oscillator as a clock system reference. The clock system reference is typically required to be frequency stable within a certain error range to ensure normal network operation. The local crystal oscillator can have a natural characteristic of aging, in which the local crystal oscillator frequency can drift over time when in operation. Such aging can cause the local oscillator frequency to drift out of the required range.

SUMMARY OF CERTAIN INVENTIVE ASPECTS

One aspect of this disclosure is an apparatus that includes a phase error detector, a phase alignment detector, and a selection circuit. The phase error detector is configured to generate an indication of a relative phase difference between a first reference clock signal and a second reference clock signal. The phase alignment detector is configured to receive the indication of the relative phase difference and determine when the relative phase difference satisfies a preset threshold. The selection circuit is configured to transition from providing the first reference clock as a clock system reference signal to providing the second reference clock as the clock system reference signal responsive to the phase alignment detector determining that the relative phase difference satisfies the preset threshold.

The first reference clock signal can have a first frequency that is different from a second frequency of the second reference clock signal, and the first reference clock signal and the second reference clock signal can be asynchronous to each other.

The phase error detector can generate the indication of the relative phase difference responsive to either rising edges or falling edges. Alternatively, the phase error detector can generate the indication of the relative phase difference responsive to both rising edges and falling edges. The indication of the relative phase difference is asserted for an amount of time proportional to the relative phase difference.

The phase alignment detector can include a delay element configured to set the preset threshold. The delay element can have an adjustable delay, wherein adjusting the adjustable delay changes the preset threshold. Alternatively or additionally, the phase alignment detector can include a flip-flop configured to capture a state of the indication of the relative phase difference responsive to an output of the delay element.

The phase error detector and the phase alignment detector can be implemented by digital circuits.

The selection circuit can include a multiplexer configured to provide the clock system reference signal. The apparatus can also include a phase-locked loop configured to receive the system reference clock signal from the selection circuit.

The apparatus can include a first crystal oscillator used to generate the first reference clock signal and a second crystal oscillator used to generate the second reference clock signal. In some embodiments, the phase error detector, the phase alignment detector, and the selection circuit can be included on an integrated circuit and a first contact of the integrated circuit can receive the first reference clock signal and a second contact of the integrated circuit can receive the second reference clock signal.

Another aspect of this disclosure is an apparatus that includes a switchover control circuit and a selection circuit. The switchover control circuit is configured to toggle a clock select signal responsive to detecting that a relative phase difference between a first reference clock and a second reference clock satisfies a preset threshold. The first reference clock and the second reference clock signals are asynchronous to each other. The selection circuit is in communication with the switchover control circuit. The selection circuit is configured to transition from providing the first reference clock signal as a clock system reference signal to providing the second reference clock signal as the clock system reference signal responsive to the switchover control signal toggling the clock select signal.

The switchover control circuit can be enabled responsive to an indication that the first reference clock signal is outside of a specified error range. Alternatively or additionally, the switchover control circuit can generate a phase error pulse that is asserted for an amount of time proportional to the relative phase difference, and toggle the clock select signal responsive to the amount of time satisfying the preset threshold.

Yet another aspect of this disclosure is an electronically-implemented method of redundant clock switchover. The method includes concurrently receiving two redundant clock signals having different frequencies. The method also includes determining when a relative phase difference between the two redundant clocks satisfies a preset threshold. The method further includes switching over from using one of the two redundant clock signals as a clock system reference signal to using the other of the two redundant clock signals as the clock system reference signal in response to determining when the relative phase difference satisfies the preset threshold.

The method can also include one or more of the following operations: activating one of the two redundant clock signals responsive to an indication that the other of the two redundant clock signals is outside of a specified error range, generating each of the two redundant clocks using different crystal oscillators, or adjusting the preset threshold.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 5B is a timing diagram associated with the phase error detector and the phase alignment detector of FIG. 5A.

DETAILED DESCRIPTION OF CERTAIN EMBODIMENTS

Figure 1:
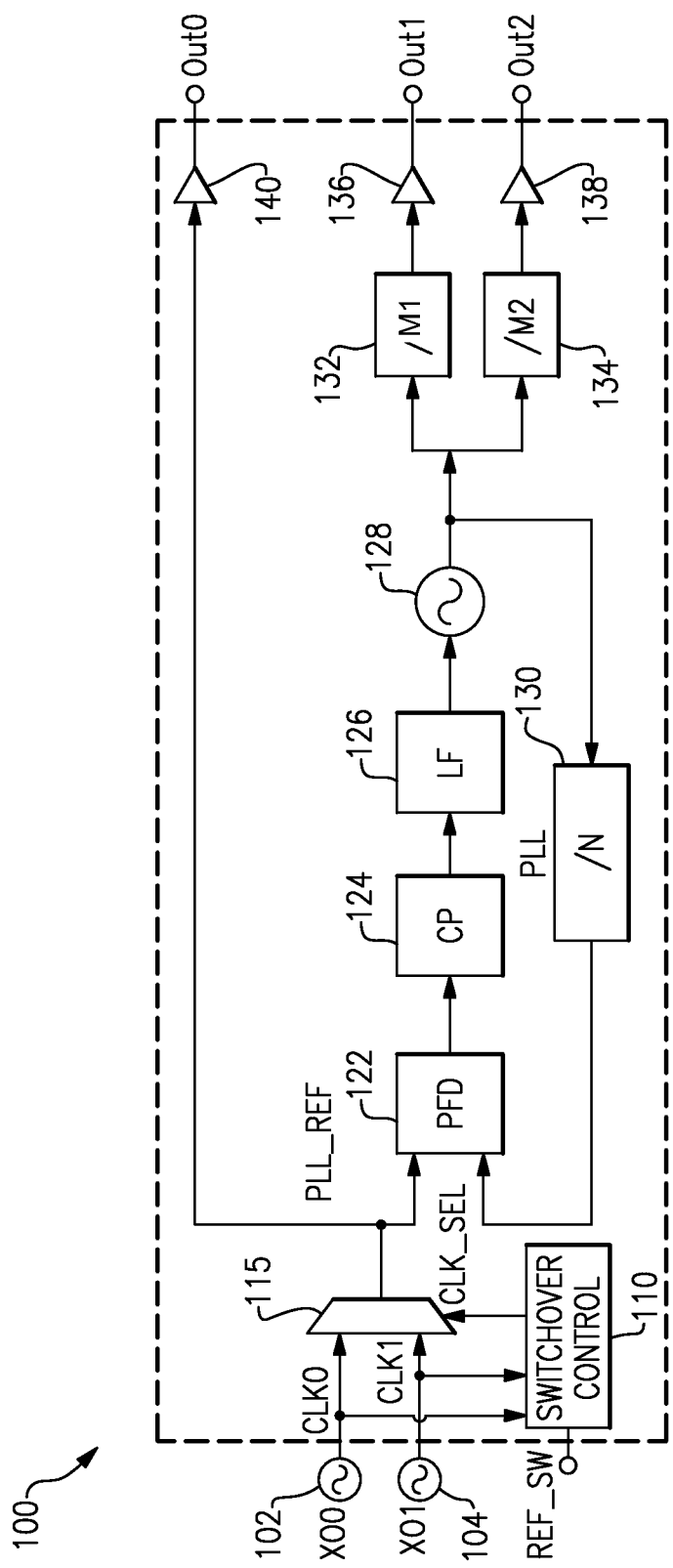
FIG. 1 is a schematic diagram of an illustrative electronic system that includes local crystal oscillators and a switchover control circuit according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale.

As discussed above, a local crystal oscillator can have a frequency that gradually drifts out of a specified error range, for example, due to a natural characteristic of frequency aging. To overcome this local oscillator slow-aging problem and avoid the costly clock system board replacement for the out-of-specification local crystal oscillator reference, redundant local crystal oscillators can be used. A first local crystal oscillator can be enabled and used as the clock system reference while the secondary local crystal oscillator is disabled. When the first local crystal oscillator frequency is determined to be outside of the specified error range (e.g., about 100 parts per million (ppm)), the secondary local crystal oscillator can be enabled and then replace the first local crystal oscillator as the clock system reference. This process can be referred to as reference switchover. Reference switchover can extend the lifetime of a clock system board without the need for repair.

Due to the asynchronous nature of separate local crystal oscillators, the phase relation between the first and second local crystal oscillators can be arbitrary. At the same time, the frequency of these local crystal oscillators can be relatively close to each other. For instance, the frequency difference between the first and second local oscillator frequencies can be less than a value selected in the range from about 20 ppm to 100 ppm. In certain applications, the variation in frequency between the first and second local oscillator frequencies can be no greater than about 10 ppm. In some instances, the frequency difference between the first and second local crystal oscillators can be approximately bounded by the local crystal oscillator specification.

Without a phase control mechanism involved, the reference switchover can introduce a relatively large phase/frequency jump or discontinuity on the selected clock system reference, as the reference switchover could occur when the first and second local crystal oscillators are significantly out of phase with each other. This can cause problems, such as interrupting network services in a network application, particularly when the clock system reference is used for a phase locked loop inside the clock system.

Aspects of this disclosure relate to controlling when clock system references are switched. This can reduce and/or minimize a phase/frequency jump on the selected clock system reference. Two separate local crystal oscillators can be enabled concurrently. These local crystal oscillators can have relatively close but different frequencies (e.g., differences on the order of a few ppm or 10 s of ppm). The initial phase difference between these two local crystal oscillators should be arbitrary. As time evolves, the phase difference between the two local crystal oscillators should walk through a full range of phase differences periodically. The signals from the two local oscillators can have a minimum phase difference at edge locations where edges of signals generated by different local oscillators align with each other. This characteristic can be used to control reference switchover. For example, responsive to determining that a phase difference is less than a threshold, a system can transition from using the first local crystal oscillator to using the second local crystal oscillator as the clock system reference. Accordingly, the system can experience approximately minimum phase/frequency disturbance. Although this disclosure discusses reference switchover in connection with crystal oscillators, any of the principles and advantages discussed herein can be applied to switching between any stable reference clock signals.

FIG. 1 illustrates an example electronic system 100 that includes local crystal oscillators 102, 104 and a switchover control circuit 110, according to an embodiment. The electronic system 100 can also include a selection circuit 115, such as a multiplexer, and a phase-locked loop. The phase-locked loop can include a phase frequency detector 122, a charge pump 124, a loop filter 126, a voltage-controlled oscillator 128, and a frequency divider 130. As one example, the electronic system 100 can be implemented in a network application. The elements within the dashed line shown in FIG. 1 can be embodied on an integrated circuit. Accordingly, the switchover control circuit 110 and the selection circuit 115 can be implemented on the same integrated circuit. As illustrated, the first and second local crystal oscillators 102, 104 are external to such an integrated circuit. At least a portion of each of the local crystal oscillators 102, 104 can be external to such an integrated circuit according to certain embodiments. The crystals of the local crystal oscillators 102, 104 can be mounted on a circuit board, for example. The electronic system 100 can include more or fewer elements than illustrated in FIG. 1.

The switchover control circuit 110 can include a phase error detector and a phase alignment detector, such as a pulse width comparator. The phase error detector can detect the relative phase difference between the local crystal oscillators 102, 104. The phase error detector can generate an indication of the relative phase difference between the reference clock signals generated by the local crystal oscillators 102 and 104, respectively. The phase alignment detector can detect when the relative phase difference satisfies a preset threshold. For instance, the phase alignment detector can detect when the relative phase difference is no greater than a desired amount. In one implementation, the preset threshold can correspond to a propagation delay of a CMOS buffer. For instance, in a 0.18

µm process, detection threshold of about 200 picoseconds (ps) can be implemented to detect a phase disturbance of less than about 200 ps. Other suitable detection thresholds can be implemented. The preset threshold can be independent of the clock frequency. When the detected relative phase difference is less than the preset threshold, the phase alignment detector can generate an output signal to transition between using a first reference clock signal and using a second reference clock signal as the system reference clock signal. Reference switchover can then occur, for example, at the next clock edge. The switchover control circuit 110 can provide a clock select signal to a selection circuit 115, which is illustrated as a multiplexer in FIG. 1, to select whether an output of the first local crystal oscillator 102 or the output of the second local crystal oscillator 104 is provided as an output of the selection circuit 115. As illustrated in FIG. 1, the output of the selection circuit 115 can be provided to a phase-locked loop.

The illustrated phase-lock loop includes the phase frequency detector 122, the charge pump 124, the loop filter 126, the voltage controlled oscillator 128, and the frequency divider 130. An output of the voltage-controlled oscillator 128 can be frequency divided by one or more frequency dividers. As shown in FIG. 1, a first frequency divider 132 can reduce the frequency of the output of the voltage-controlled oscillator 128 by a factor of M1 and a second frequency divider 134 can reduce the frequency of the output of the voltage-controlled oscillator 128 by a factor of M2, which can be different than M1. Signals having a frequency divided version of the voltage-controlled oscillator 128 can be provided to an output contact of an integrated circuit. As shown in FIG. 1, outputs of the first and second frequency dividers 132 and 134 can be buffered by buffers 136 and 138, respectively. The output of the buffers 136 and 138 can be provided to contacts, such as pins, of the integrated circuit that includes the switchover control circuit 110, the selection circuit 115, and the phase-locked loop. In addition, the reference clock output by the selection circuit 115 can be buffered by a buffer 140 and provided to a contact of the integrated circuit.

Figure 2:
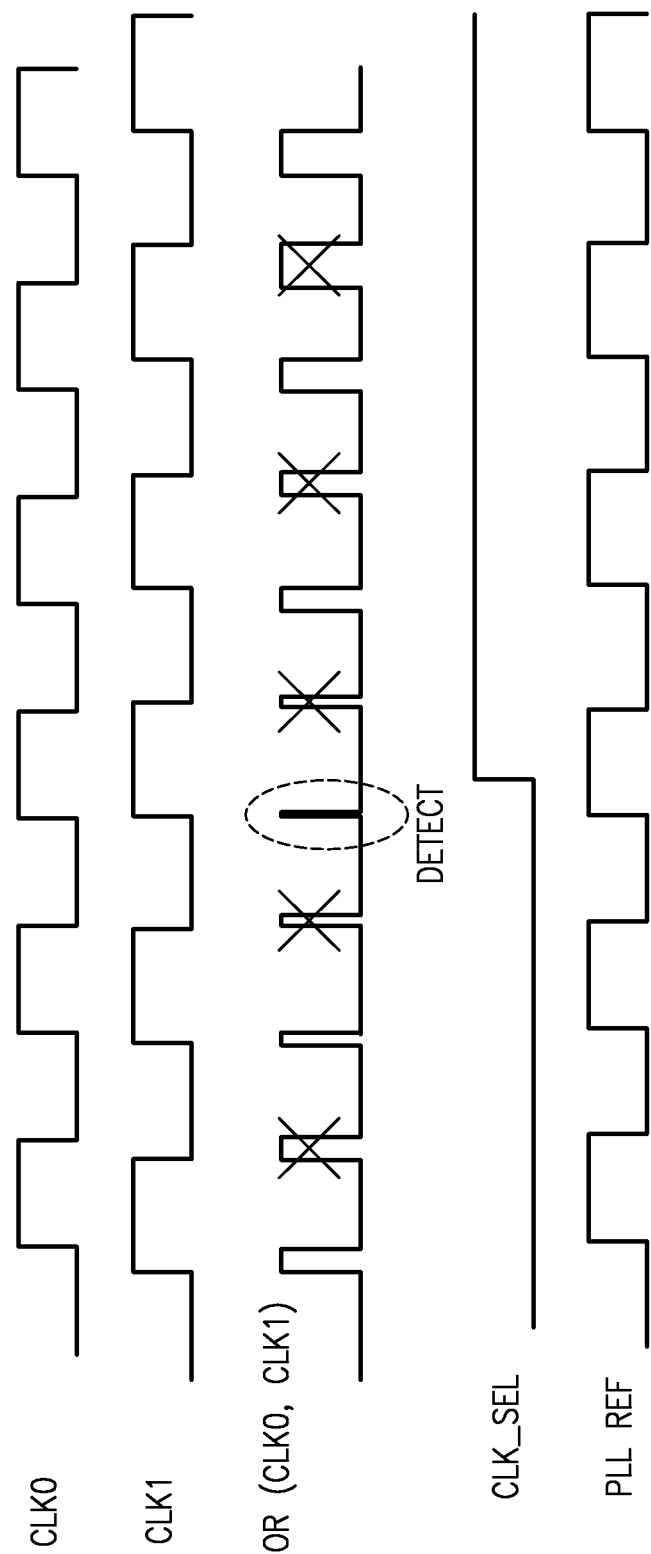
FIG. 2 is a timing diagram shows timing of reference switchover according to an embodiment.

FIG. 2 is a timing diagram illustrating a time at which reference switchover can occur in the circuits disclosed herein. This drawing may not be proportional. The output of a first oscillator, such as the first local crystal oscillator 102 of FIG. 1, is labeled CLK0 in FIG. 2. The output of a second oscillator, such as the second local crystal oscillator 104 of FIG. 1, is labeled CLK1 in FIG. 2. An XOR logic function of CLK0 and CLK1 can generate a signal indicative of a phase error between CLK0 and CLK1. The logical XOR of CLK0 and CLK1 can be detected for one edge of CLK0 and CLK1, such as the rising edge as illustrated or alternatively for the falling edge. Responsive to detecting that the pulse generated by the logical XOR of CLK0 and CLK1 is asserted for an amount of time that is less than a preset threshold, a clock select signal CLK_SEL can transition. As shown in FIG. 2, the phase-locked loop reference PLL_REF can track CLK0 until reference switchover occurs and then track CLK1 after reference switchover occurs. Reference switchover can occur in the next clock phase or clock cycle after the clock select signal CLK_SEL transitions.

Figure 3:
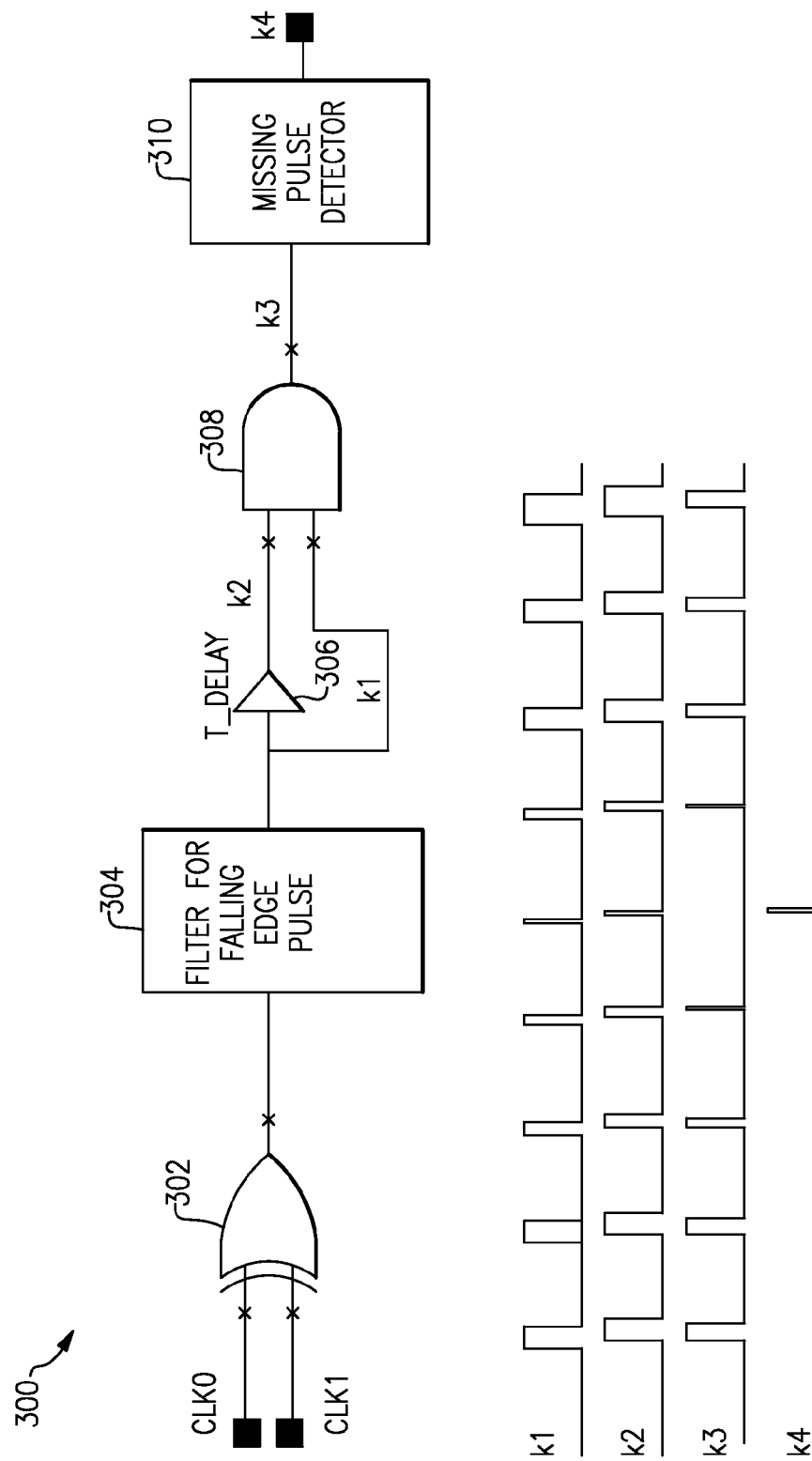
FIG. 3 includes a block diagram and an associated timing diagram illustrating reference switchover according to an embodiment.

FIG. 3 includes a block diagram 300 with an associated timing diagram illustrating reference switchover according to an embodiment. A logical XOR can be performed on the outputs of two reference clocks, such as local crystal oscillators 102 and 104 of FIG. 1. As illustrated, XOR circuit 302 can perform a logical XOR of the first reference clock signal CLK0 and the second reference clock signal CLK1. The XOR circuit 302 can output a logic low level when the first reference clock signal CLK0 and the second reference clock signal CLK1 have the same logic level. Conversely, the XOR circuit 302 can output a logic high level when the first reference clock signal CLK0 and the second reference clock signal CLK1 have different logic levels. An amount of time that the first reference clock signal CLK0 and the second reference clock signal CLK1 are in different phases can be indicative of the relative phase difference between the reference clocks. The output of the XOR circuit 302 can be a pulse signal that is asserted for an amount of time corresponding to the relative phase difference between the reference clocks. When the pulse signal is asserted, it can be in an active logic state. The active logic state can be a logic low state or a logic high state depending on the circuit implementation. In FIG. 3, the pulse signal output from the XOR circuit 302 is asserted to a logic high state.

Pulses indicative of a phase error between the reference clock signals can be filtered such that a pulse for one clock edge, such as the falling edge, is detected. The filter 304 illustrated in FIG. 3 can implement such filtering. In the timing diagram of FIG. 3, an output of the filter 304 is labeled k1. A pulse for the one clock edge can be delayed by a delay element 306. The delay element 306 can include one or more inverters. The delay element 306 illustrated in FIG. 3 is a buffer that has a delay of T_delay. In the timing diagram of FIG. 3, an output of the delay element 306 is labeled k2.

A logical AND of the pulse and the delayed pulse can detect whether the pulse width is less than the delay T_delay, which can implement a preset threshold. An AND circuit 308 can perform the logical AND function of the pulse and the delayed pulse. In the timing diagram of FIG. 3, an output of the AND circuit 308 is labeled k3. When the pulse and the delayed pulse are both asserted, the AND circuit 308 will generate a shorter pulse as shown in the timing diagram of FIG. 3. When the pulse and the delayed pulse are not asserted at the same time during a clock cycle, the output of the AND circuit 308 will remain unasserted during the clock cycle. This indicates that the relative phase difference between the first reference clock signal CLK0 and the second reference clock signal CLK1 is less than the present threshold.

A missing pulse detector 310 can then detect when the pulse width is less than the preset threshold. In response, the clock select signal CLK_SEL can be asserted. In the timing diagram of FIG. 3, an output of the missing pulse detector 310 is labeled k4. The output of the missing pulse detector 310 can be captured by a state element, such as a flip-flop and the output of the flip-flop can provide the clock select signal CLK_SEL. The clock select signal CLK_SEL can be provided to a selection circuit, such as the multiplexer illustrated in FIG. 1. Asserting the clock select signal CLK_SEL can cause a system to transition from using the first reference clock signal CLK0 to using the second reference clock signal CLK1 as a clock system reference.

Other logically equivalent circuits can implement the phase error detection and the phase alignment detection illustrated in FIG. 3. A circuit implementation can perform the logical functions illustrated in FIG. 3 in a different order and/or combine the logical functions using equivalent circuits.

Figure 4:
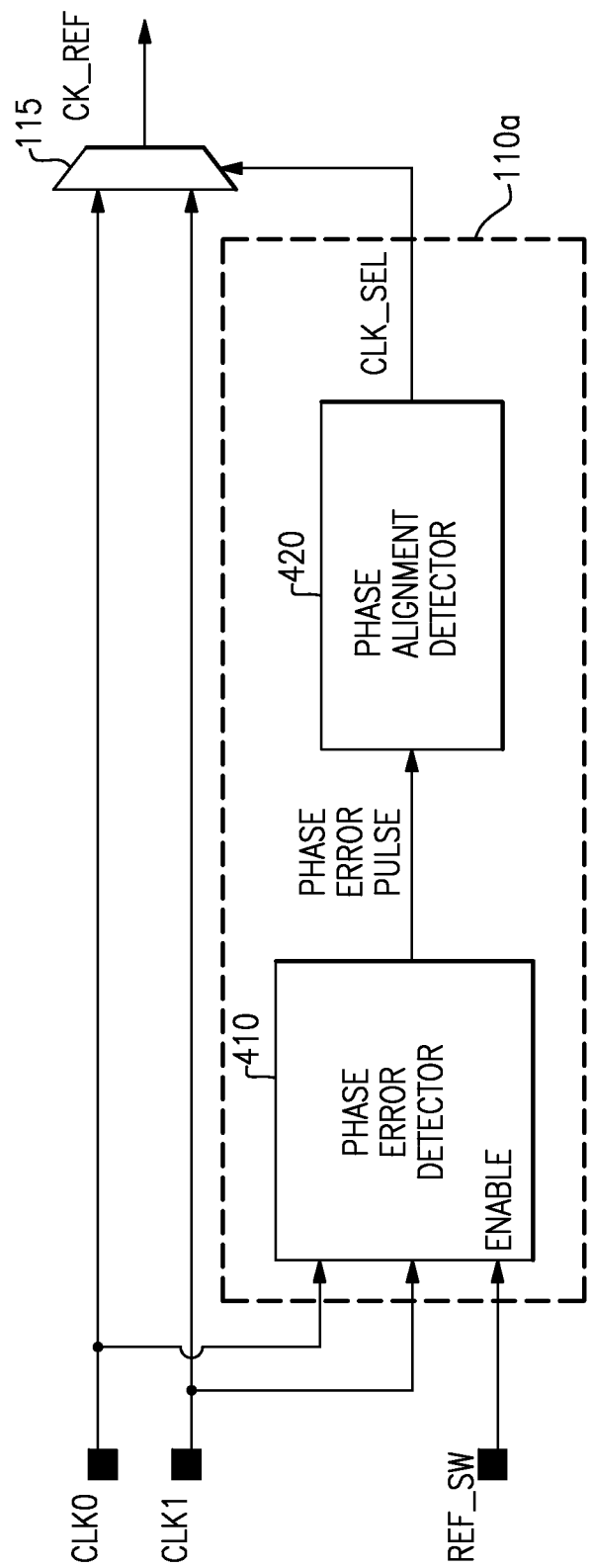
FIG. 4 is a schematic block diagram of an illustrative switchover control circuit and a selection circuit according to an embodiment.

FIG. 4 illustrates an embodiment of a switchover control circuit 110*a* and a selection circuit 115 according to an embodiment. The switchover control circuit 110*a* can include a phase error detector 410 and a phase alignment detector 420. The illustrated switchover control circuit 110*a* can implement the switchover control circuit 110 of FIG. 1, for example.

The phase error detector 410 can receive a reference switchover signal REF_SW as an enable signal. The reference switchover signal REF_SW can enable the phase error detector 410 responsive to the reference clock being provided as the clock system reference being outside of a specified error range. The phase error detector 410 can generate a phase error pulse indicative of the phase error between a first reference clock signal CLK0 and a second reference clock signal CLK1. The first reference clock signal CLK0 and the second reference clock signal CLK1 can be asynchronous to each other. The phase error pulse can be a logical XOR or a logical XNOR of the first reference clock signal CLK0 and the second reference clock signal CLK1. The phase error pulse can correspond to a relative phase difference between the first reference clock signal CLK0 and the second reference clock signal CLK1 at one of two clock edges, such as at the rising edge, according to certain embodiments. In some other embodiments, the phase error pulse can correspond to a relative phase difference between the first reference clock signal CLK0 and the second reference clock signal CLK1 at both the rising and falling clock edges. The phase error pulse can be asserted for an amount of time corresponding to the amount of time between the rising edges of the first reference clock signal CLK0 and the second reference clock signal CLK1 in the same clock cycle. Accordingly, the phase error pulse can be asserted for an amount of time corresponding to the relative phase difference between the first reference clock signal CLK0 and the second reference clock CLK1. According to some embodiments, the phase error detector 410 can generate a signal indicative of the relative phase difference in different ways. For instance, the phase error detector 410 can generate a signal having a signal level indicative of the relative phase difference between the different reference clocks in an embodiment.

The phase alignment detector 420 can detect when the clock edges of the first reference clock signal CLK0 and the second reference clock signal CLK1 are aligned within a preset threshold. The phase alignment detector 420 can receive an indication of the relative phase difference from the phase error detector 410 and detect when the relative phase difference satisfies the preset threshold.

The phase alignment detector 420 can be a pulse width comparator that detects when a phase error pulse is asserted for no longer than a preset threshold. The phase alignment detector can include a delay element, and the preset threshold can correspond to the delay of the delay element. In certain embodiments, the delay element can have an adjustable delay, and adjusting the adjustable delay can change the preset threshold. The phase alignment detector 420 can also include a flip-flop configured to capture a state of the output of the phase error detector 410 responsive to an output of the delay element.

When the output of the phase error detector, such as a phase error pulse, indicates that the relative phase difference between the first reference clock signal CLK0 and the second reference clock signal CLK1 is less than the preset threshold, the phase alignment detector 420 can toggle the clock select signal CLK_SEL. Responsive to the clock select signal CLK_SEL toggling, the selection circuit 115 can provide the second reference clock signal CLK1 as the reference clock signal CK_REF instead of the first reference clock signal CLK0. The reference clock signal CK_REF can correspond to the clock system reference PLL_REF of FIG. 1 in some embodiments. The reference switchover control provided by the phase error detector 410 and the phase alignment detector 420 can implement reference switchover without significantly disturbing an electronic system that uses the reference clock signal CK_REF.

Figure 5A:
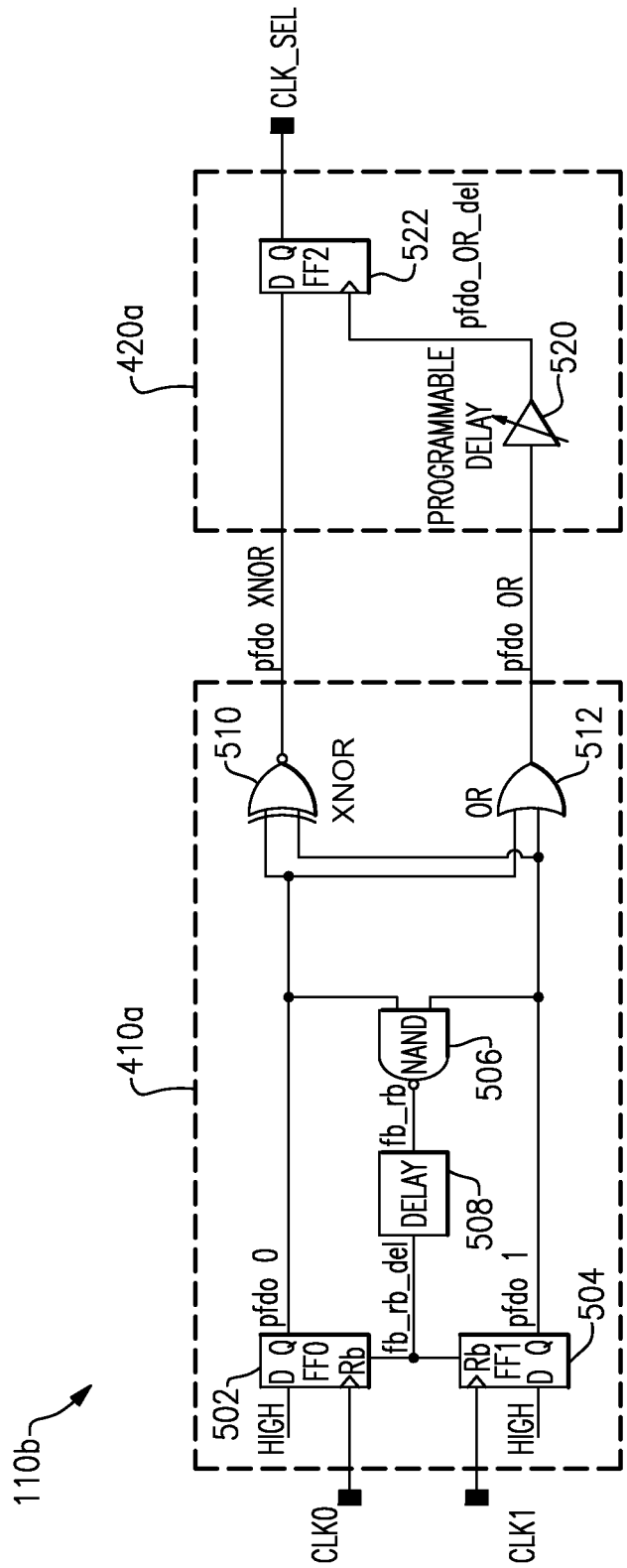
FIG. 5A is a schematic diagram of an illustrative phase error detector and an illustrative phase alignment detector according to an embodiment.
Figure 5C:
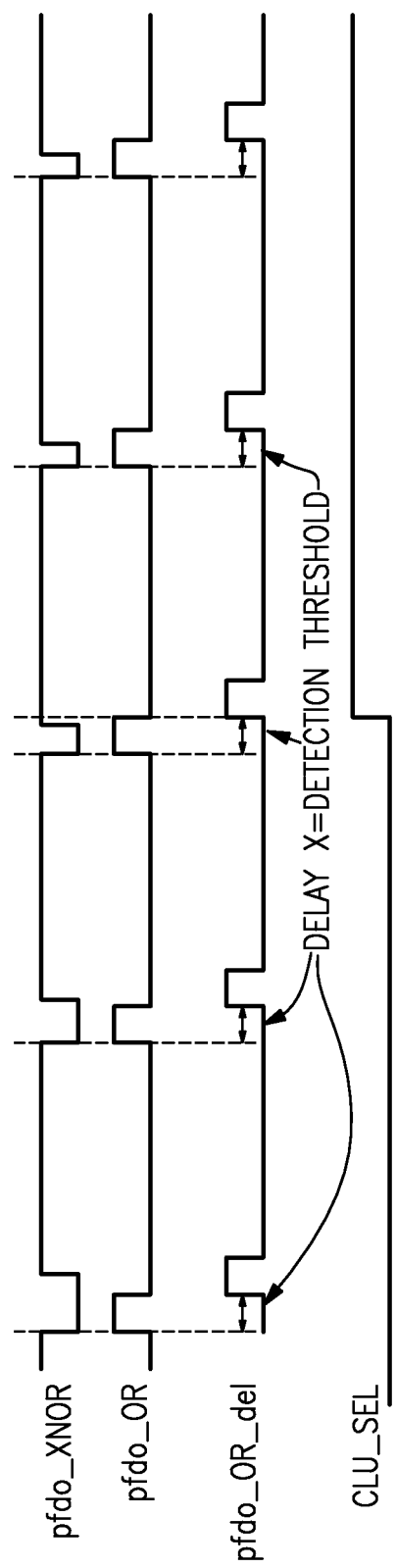
FIG. 5C is a timing diagram associated with the phase alignment detector of FIG. 5A.

FIG. 5A illustrates an embodiment of a phase error detector 410a and a phase alignment detector 420a. The phase error detector 410 of FIG. 4 can include any combination of features of the phase error detector 410a of FIG. 5A. Similarly, the phase alignment detector 420 of FIG. 4 can implement any combination of features of the phase alignment detector 420a of FIG. 5A. The phase error detector 410a and the phase alignment detector 420a can be implemented by digital circuits as shown in FIG. 5A. The illustrated phase alignment detector 420a is a pulse width comparator that can detect when a phase error pulse from the phase error detector 410a is asserted for more or less time than a preset threshold implemented by a delay element. FIG. 5B is a timing diagram of signals in the phase error detector 410a and the phase alignment detector 420a of FIG. 5A. FIG. 5C is a timing diagram of signals in the phase alignment detector 420a of FIG. 5A.

The phase error detector 410a can include flip-flops 502 and 504, a NAND gate 506, a delay element 508, an XNOR gate 510, and an OR gate 512. The first flip-flop 502 can receive the first reference clock signal CLK0 at a clock input, and the second flip-flop 504 can receive the second reference clock signal CLK1 at a clock input. The illustrated flip-flops 502 and 504 are D-type flip-flops with D inputs set to a value corresponding to a high logic state. The outputs pfdo_0 and pfdo_1 of the flip-flops 502 and 504, respectively, are provided to the NAND gate 506. The output fb_rb of the NAND gate 506 is provided to the delay element 508. The delay element 508 can include one or more inverters or other gates, such as the buffer illustrated in FIG. 5A. The delay element 508 provides a reset signal fb_rb_del to reset inputs of the flip-flops 502 and 504. The NAND gate 506 and the delay element 508 cause the outputs pfdo_0 and pfdo_1 of the flip-flops 502 and 504, respectively, to be de-asserted responsive to second of these outputs going high. The propagation delay through the NAND gate 506 and the delay element 508 can determine how long the outputs pfdo_0 and pfdo_1 of the flip-flops 502 and 504, respectively, are asserted.

The XNOR gate 510 can perform a logical XNOR on the outputs of the flip-flops 502 and 504. A logical XNOR function generates an output having a logic high value when input signals have same state and a logic low value when input signals have different states. The output pfdo_XNOR of the XNOR gate 510 can be an error pulse that is asserted for an amount of time corresponding to the relative phase difference between the first reference clock signal CLK0 and the second reference clock signal CLK1. As illustrated in FIG. 5B, the output pfdo_XNOR of the XNOR gate 510 is asserted in a logic low state when input signals have different states. The functionality of the NAND gate 506 and the delay element 508 can reset the flip-flops 502 and 504 such that the XNOR gate 510 generates the phase error pulse that is generated for one type of clock edge, such as the rising edge in the embodiment of FIG. 5A.

The illustrated phase alignment detector 420a includes a programmable delay element 520 and a flip-flop 522. The programmable delay element 520 has an adjustable delay. The programmable delay element 520 can delay the output pdfo_OR of the OR gate 512 and provide a delayed version of the output of the OR gate 512 to a clock input of the flip-flop 522. In certain embodiments, a chain of flip-flops arranged in series can implement the functionality of the flip-flop 522. This can overcome possible metastability problems in some applications. The illustrated flip-flop 522 is a D-type flip-flop that receives the output pfdo_XNOR of the XNOR gate 510 at a D input. Accordingly, the flip-flop 522 can generate a clock select signal CLK_SEL. The clock select signal CLK_SEL can be provided to the selection circuit 115 of FIGS. 1 and/or 4. Reference switchover can occur responsive to the clock select signal CLK_SEL toggling.

As illustrated in FIG. 5B, the output pfdo_OR of the OR gate 512 is delayed by X, which can be set to be the same as the CLK0/CLK1 edge skew threshold. The delay X can be programmable as illustrated in FIG. 5A. Using the delayed signal pfdo_OR_del as a clock input to a state element, such as the flip-flop 522 of FIG. 5A, can sample the output pfdo_XNOR of the XNOR gate 510 using the state element. When the CLK0/CLK1 edge skew is larger than X, the delayed signal pfdo_OR_del rising edge is within the error pulse pfdo_XNOR low state and the state element stores a logic 0 value. This indicates that the relative phase difference between the first reference clock signal CLK0 and the second reference clock signal CLK1 does not satisfy the edge skew threshold. On the other hand, when the clock signal CLK0/CLK1 edge skew is smaller than X, the delayed signal pfdo_OR_del rising edge is outside the error pulse pfdo_XNOR low state and the statement element stores a logic 1 value. This indicates that the relative phase difference between the first reference clock signal CLK0 and the second reference clock signal CLK1 does satisfies the edge skew threshold. In the circuit illustrated in FIG. 5A, the logic 1 value is a flag for detecting relative phase alignment.

FIG. 5C illustrates a timing diagram for the phase alignment detector 420a. The clock select signal CLK_SEL toggles responsive to overlap between the delayed signal pfdo_OR_del and the output pfdo_XNOR being high at the same time. More specifically, the clock select signal CLK_SEL toggles when the output pfdo_XNOR of the XNOR gate 510 is high during a rising edge of the delayed signal pfdo_OR delay.

Figure 6:
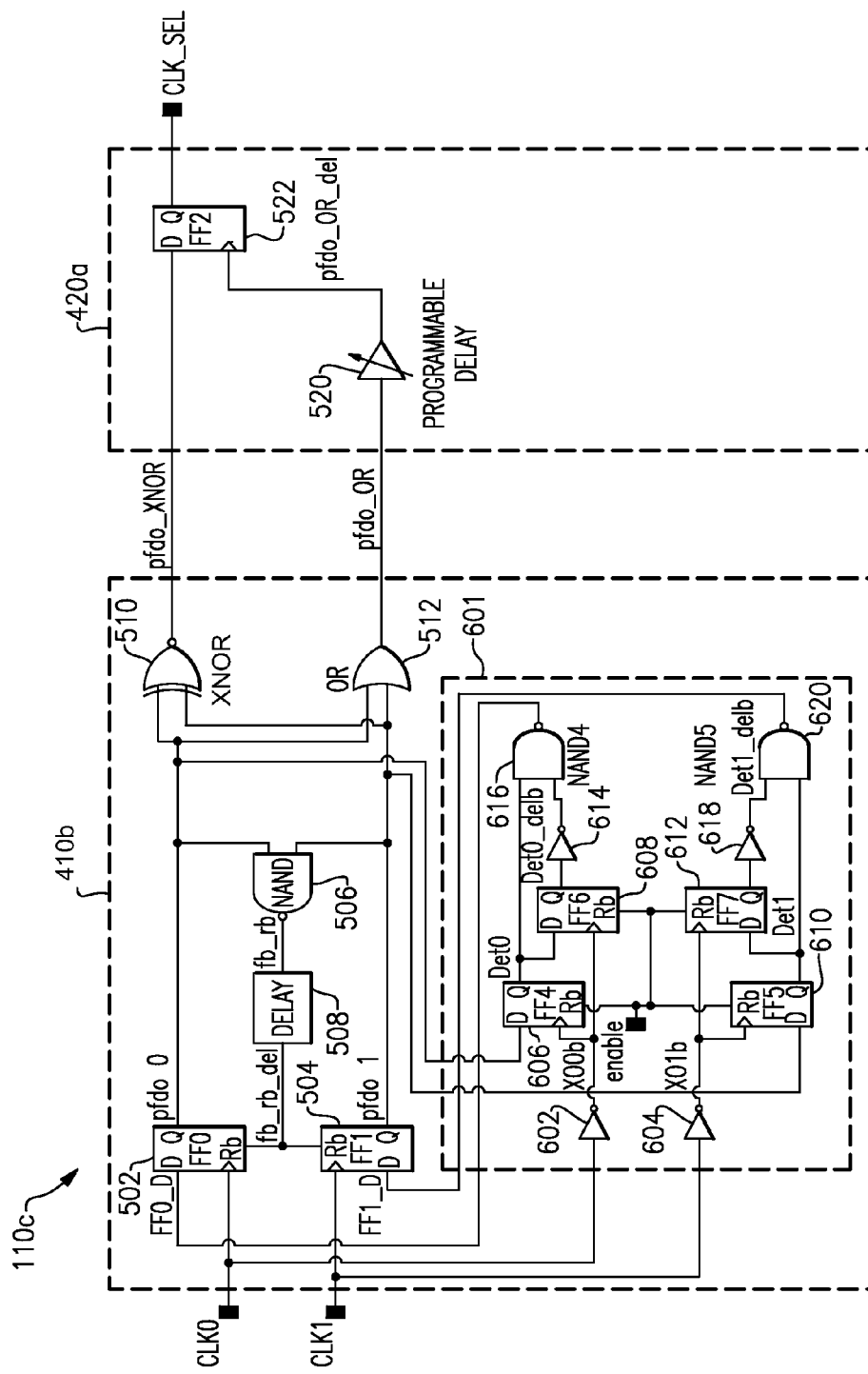
FIG. 6 is a schematic diagram of an illustrative phase error detector and an illustrative phase alignment detector according to another embodiment.

FIG. 6 illustrates an embodiment of a phase error detector 410b and a phase alignment detector 420a. The phase error detector 410 of FIG. 4 can include any combination of features of the phase error detector 410b of FIG. 6. The illustrated phase alignment detector 420b is a pulse width comparator. The phase alignment detector 420a can implement the same functionalities as discussed with reference to FIGS. 5A to 5C.

The phase error detector 410b of FIG. 6 includes additional circuitry compared to the phase error detector 410a of FIG. 5A. The additional circuitry can include a phase error capping circuit 601 to prevent the phase error from approaching a full cycle of 2π radians. Phase error can represent time between a rising edge of a lagging clock relative to the corresponding rising edge of a leading clock. The phase error capping circuit 601 can detect when the phase error is more than one half of a cycle of the leading clock. Responsive to detecting that the phase error is more than one half of a cycle of the leading clock, the phase error capping circuit 601 can change the phase error polarity by changing which clock is the leading clock. This should ensure that the phase error for the next clock cycle is less than half of a clock cycle. Accordingly, the phase error capping circuit 601 should prevent the phase error from approaching a full cycle of 2π radians.

The phase error capping circuit 601 can include inverters 602 and 604 to invert the first and second reference clocks CLK0 and CLK1, respectively. A first signal path associated with the first reference clock signal CLK0 will be described below. The first signal path can include the inverter 602, flip-flops 606 and 608, inverter 614 and NAND gate 616. A second signal path associated with the second reference clock signal CLK1 can be substantially the same as the first signal path except that the second signal path is coupled to different inputs and outputs. As illustrated, the second signal path can includes the inverter 604, flip-flops 610 and 612, inverter 618 and NAND gate 620.

The inverted first reference clock can be provided to the flip-flop 606. As such, the output of the flip-flop 502 can be sampled responsive to a falling edge of the first reference clock signal CLK0 using the flip-flop 606. The flip-flop 608 can sample the previous state of the flip-flop 606 using the inverted first reference clock. The flip-flops 606 and 608 can receive an active low enable signal Enable at reset inputs. The output of the flip-flop 608 can be inverted using inverter 614 as illustrated. Alternatively the flip-flop 608 can provide an active low output. NAND gate 616 can perform a NAND function on the sampled value Det0 from the flip-flop 606 and an inverted version of the value sampled by the flip-flop 608 (for example, as provided by the output of the illustrated inverter 614). The output of the NAND gate 616 should be at a logic high value responsive to the phase error being less than half of the clock cycle of the first reference clock. The output of the NAND gate 616 should be at a logic low value responsive to the phase error being more than half of the clock cycle of the first reference clock. The output of the NAND gate 616 can be sampled by the flip-flop 502, for example, by being provided to the D input when the flip-flop 502 is a D-type flip-flop as illustrated.

When the sampled value Det0 has a logic low value, the phase error is less than the first half cycle of the first reference clock, which is the leading clock in this example. The sampled value Det0 having a logic low value can provide a logic high input to the flip-flop 502 via the NAND gate 616. In this case, the phase error detection of the phase error detector 410b can function like the phase error detector 410a of FIG. 5A.

On the other hand, when the sampled value Det0 has a logic high value, the phase error can be more than the first half cycle of the first reference clock. The inverted version of the previous state of the flip-flop 606 together with the sampled value Det0 can together set the input to the flip-flop 502 to a logic low level for one cycle. For example, the NAND gate 616 can provide a logic low level to the D-input of the illustrated flip-flop 502 for one cycle. Accordingly, the second reference clock signal CLK1 can become the leading clock for determining phase error in the phase error detector 410b.

The flip-flops 606 and 610 illustrated in FIG. 6 can each be implemented as a series chain of flip-flops (e.g., a series chain of 3 flip-flops) according to certain implementations. In some instances, the series chain of flip-flops can overcome potential meta-stability problems. Likewise, the flip-flop 522 of the phase alignment detector 420a can also be implemented by a series chain of flip-flops. As previously mentioned, the second signal path with the inverter 604, the flip-flop 610, and the like, can operate in substantially the same manner as the first signal path.

In the embodiments described above, apparatus, systems, and methods for reference switchover are described in connection with particular embodiments. It will be understood, however, that the principles and advantages of the embodiments can be used for any other systems, apparatus, or methods with a need for smooth reference switchover. Although certain embodiments are described with reference a local crystal oscillator, it will be understood that the principles and advantages described herein can be applied to signals generated by other oscillators. While the disclosed embodiments may be described with reference to two redundant clocks, the principles and advantages discussed herein can be applied to systems with three or more redundant clocks. Moreover, while some logic circuits are provided for illustrative purposes, other logically equivalent circuits can alternatively be implemented to achieve the functionality described herein.

The principles and advantages described herein can be implemented in various apparatuses. Examples of such apparatuses can include, but are not limited to, consumer electronic products, parts of the consumer electronic products, electronic test equipment, etc. Examples of parts of consumer electronic products can include clocking circuits, analog-to-digital converts, amplifiers, rectifiers, programmable filters, attenuators, variable frequency circuits, etc. Examples of the electronic devices can also include memory chips, memory modules, circuits of optical networks or other communication networks, and disk driver circuits. Consumer electronic products can include, but are not limited to, wireless devices, a mobile phone (for example, a smart phone), cellular base stations, a telephone, a television, a computer monitor, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments. The acts of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. An apparatus comprising:
   a phase error detector configured to generate an indication of a relative phase difference between a first reference clock signal and a second reference clock signal;
   a first terminal configured to receive the first reference clock signal, wherein the first reference clock signal is generated by a first oscillator;
   a second terminal configured to receive the second reference clock signal, wherein the second reference clock signal is generated by a second oscillator separate from the first oscillator;
   a phase alignment detector configured to receive the indication of the relative phase difference and determine when the relative phase difference satisfies a preset threshold; and
   a selection circuit configured to transition from providing the first reference clock as a clock system reference signal to providing the second reference clock as the clock system reference signal responsive to the phase alignment detector determining that the relative phase difference satisfies the preset threshold, wherein the first reference clock signal and the second reference clock signal have arbitrary phases relative to each other.

2. The apparatus of claim 1, further comprising:
   a first crystal oscillator, wherein the first reference clock signal is generated using the first crystal oscillator; and
   a second crystal oscillator, wherein the second reference clock signal is generated using the second crystal oscillator.

3. The apparatus of claim 2, further comprising:
   an integrated circuit comprising the phase error detector, the phase alignment detector, and the selection circuit, the integrated circuit further comprising a first contact configured to receive the first reference clock signal and a second contact configured to receive the second reference clock signal; and
   wherein a first crystal of the first crystal oscillator and a second crystal of the second crystal oscillator are external to the integrated circuit.

4. The apparatus of claim 1, wherein the first reference clock signal has a first frequency that is different from a second frequency of the second reference clock signal, and wherein the first reference clock signal and the second reference clock signal are asynchronous to each other.

5. The apparatus of claim 1, wherein the indication of the relative phase difference is asserted for an amount of time proportional to the relative phase difference.

6. The apparatus of claim 1, wherein the selection circuit comprises a multiplexer configured to provide the clock system reference signal.

7. The apparatus of claim 1, further comprising a phase-locked loop, wherein the phase-locked loop is configured to receive the system reference clock signal from the selection circuit.

8. The apparatus of claim 1, wherein the phase error detector and the phase alignment detector are implemented by digital circuits.

9. The apparatus of claim 1, wherein the phase error detector is configured to generate the indication of the relative phase difference responsive to either rising edges or falling edges.

10. The apparatus of claim 1, wherein the phase error detector is configured to generate the indication of the relative phase difference responsive to both rising edges and falling edges.

11. The apparatus of claim 1, wherein the phase alignment detector comprises a delay element, wherein the delay element is configured to set the preset threshold.

12. An apparatus comprising:
- a phase error detector configured to generate an indication of a relative phase difference between a first reference clock signal and a second reference clock signal, the phase error detector comprising a delay element configured to set a preset threshold, wherein the delay element has an adjustable delay, and wherein adjusting the adjustable delay changes the preset threshold;
- a phase alignment detector configured to receive the indication of the relative phase difference and determine when the relative phase difference satisfies the preset threshold; and
- a selection circuit configured to transition from providing the first reference clock as a clock system reference signal to providing the second reference clock as the clock system reference signal responsive to the phase alignment detector determining that the relative phase difference satisfies the preset threshold.

13. The apparatus of claim 11, wherein the phase alignment detector comprises a flip-flop configured to capture a state of the indication of the relative phase difference responsive to an output of the delay element.

14. An apparatus comprising:
- a switchover control circuit configured to toggle a clock select signal responsive to detecting that a relative phase difference between a first reference clock and a second reference clock is less than a preset threshold, wherein the relative phase difference being less than the preset threshold indicates that the first reference clock signal and the second reference clock signal are sufficiently aligned for switchover, and wherein the first reference clock and the second reference clock signals are asynchronous to each other; and
- a selection circuit in communication with the switchover control circuit, the selection circuit configured to transition from providing the first reference clock signal as a clock system reference signal to providing the second reference clock signal as the clock system reference signal responsive to the switchover control signal toggling the clock select signal.

15. The apparatus of claim 14, wherein the preset threshold corresponds to a buffer delay.

16. The apparatus of claim 14, wherein the switchover control circuit is enabled responsive to an indication that the first reference clock signal is outside of a specified error range.

17. The apparatus of claim 14, wherein the switchover control circuit is configured to generate a phase error pulse that is asserted for an amount of time proportional to the relative phase difference, and to toggle the clock select signal responsive to the amount of time satisfying the preset threshold.

18. An electronically-implemented method of redundant clock switchover, the method comprising:
- concurrently receiving two redundant clock signals having different frequencies, the two redundant clock signals being generated from separate oscillators, and the two redundant clock signals having phases that are arbitrary relative to each other;
- determining when a relative phase difference between the two redundant clocks is less than a preset threshold; and
- responsive to a reference switchover signal being asserted and to said determining, switching over from using one of the two redundant clock signals as a clock system reference signal to using the other of the two redundant clock signals as the clock system reference signal.

19. The method of claim 18, further comprising activating one of the two redundant clock signals responsive to an indication that the other of the two redundant clock signals is outside of a specified error range.

20. The method of claim 18, further comprising generating each of the two redundant clocks using different crystal oscillators.

21. The method of claim 18, further comprising adjusting the preset threshold.

* * * * *